(12) United States Patent
Kaidu et al.

(10) Patent No.: US 10,575,436 B2
(45) Date of Patent: Feb. 25, 2020

(54) MOTOR DRIVE CONTROL APPARATUS, FAN, AND MOTOR CONTROL METHOD

(71) Applicant: MINEBEA MITSUMI INC., Kitasaku-Gun, Nagano (JP)

(72) Inventors: Hiroyuki Kaidu, Kakegawa (JP); Masato Aoki, Iwata (JP)

(73) Assignee: Minebea Mitsumi Inc., Nagano (JP)

( * ) Notice: Subject to any disclaimer, the term of this patent is extended or adjusted under 35 U.S.C. 154(b) by 0 days.

(21) Appl. No.: 16/259,315

(22) Filed: Jan. 28, 2019

(65) Prior Publication Data

US 2019/0307017 A1    Oct. 3, 2019

(30) Foreign Application Priority Data

Mar. 30, 2018  (JP) ................................ 2018-069535

(51) Int. Cl.
| | | |
|---|---|---|
| *G05B 5/00* | (2006.01) | |
| *H05K 7/20* | (2006.01) | |
| *H02P 29/68* | (2016.01) | |
| *G06F 1/20* | (2006.01) | |
| *H02P 3/06* | (2006.01) | |

(52) U.S. Cl.
CPC ......... *H05K 7/20209* (2013.01); *H02P 29/68* (2016.02); *G06F 1/20* (2013.01); *H02P 3/06* (2013.01)

(58) Field of Classification Search
CPC ............... H02P 29/68; H05K 7/20209; G05B 2219/2614
See application file for complete search history.

(56) References Cited

U.S. PATENT DOCUMENTS

2007/0071592 A1* 3/2007 Lin ....................... F04D 27/004
                                                              415/47
2015/0263649 A1   9/2015 Omura

FOREIGN PATENT DOCUMENTS

JP      2015-177702 A    10/2015

* cited by examiner

*Primary Examiner* — Karen Masih
(74) *Attorney, Agent, or Firm* — Carrier Blackman & Associates, P.C.; Joseph P. Carrier; William D. Blackman

(57) ABSTRACT

A motor drive control apparatus is mounted on a fan having a motor and an impeller coupled to the motor. The motor drive control apparatus includes a temperature sensor for measuring a temperature correlated with a temperature of the impeller, a temperature comparing portion for comparing a detected temperature based on a measurement result of the temperature sensor with a first temperature higher than a highest value of a design temperature of the fan, a rotation speed setting portion for setting an upper limit value of the rotation speed of the motor based on a comparison result the temperature comparing portion, a PWM command portion for controlling such that the rotation speed of the motor does not exceed the upper limit value set by the rotation speed setting portion.

12 Claims, 12 Drawing Sheets

MOTOR DRIVE CONTROL APPARATUS, FAN, AND MOTOR CONTROL METHOD

CROSS-REFERENCE TO RELATED APPLICATION

This application claims priority from Japanese Patent Application No. 2018-069535 filed on Mar. 30, 2018, the entire subject-matter of which is incorporated herein by reference.

TECHNICAL FIELD

The present disclosure relates to a motor drive control apparatus for driving a motor to which a non-heat-generating component is coupled, a fan, and a motor control method.

BACKGROUND

In recent years, a motor drive control apparatus which detects a possibility of overheating of an element constituting a circuit and suppresses overheating of the element is disclosed (for example, JP-A-2015-177702).

JP-A-2015-177702 discloses that, in the motor control device, a temperature of the element constituting the circuit is calculated based on a temperature of the circuit, a rotation speed of a motor, and a load of the circuit and a duty ratio corresponding to the rotation speed of the motor is lowered when the temperature of the element is equal to or higher than a predetermined value.

In a fan or the like where a resinous impeller is coupled to a motor, when the impeller which is a non-heat-generating component rotates at a high speed under a high environment temperature where a blade of the impeller is easy to deform, there is a possibility that the blade is deformed and an abnormal states such as damage of the blade and damage of a casing of the fan occurs. In general, an operation guarantee temperature is predetermined for use of a device using such a motor and it is recommended to be used under an environment temperature where the possibility of occurrence of such an abnormal state is low. However, in actuality, it is assumed that there is a possibility that the device is used in a state where an ambient temperature exceeds an operation guarantee temperature, and thus it is desirable that the possibility of occurrence of an abnormal state can be lowered even when the device is used in such a state described above.

In a method of suppressing overheating of an element which generates heat by detecting a temperature of a circuit as described in JP-A-2015-177702, the duty ratio is not limited unless the temperature is considerably high. Therefore, such a method cannot be used to prevent occurrence of an abnormal state such as damage of a non-heat-generating component such as the blade of the impeller as described above.

Further, when an IC or the like which causes thermal shutdown at a temperature at which a temperature of an element is relatively low is used for the motor drive control apparatus, there is a possibility that occurrence of an abnormal state can be prevented, but there is a problem that a situation that a motor does not rotate increases. For example, in a fan, there is a problem that the function thereof is frequently impaired in spite of being used for cooling a heat-generating object.

SUMMARY

An object of the disclosure is to provide a motor drive control apparatus, a fan, and a motor control method capable of reducing a possibility of occurrence of an abnormal state in a non-heat-generating component.

One aspect of the disclosure provides a motor drive control apparatus mounted on a motor device having a motor and a non-heat-generating component coupled to the motor, including:

a temperature sensor that measures a temperature correlated with a temperature of the non-heat-generating component;

a temperature comparing portion configured to compare a detected temperature based on a measurement result of the temperature sensor with a predetermined first temperature higher than a highest value of a design temperature of the motor device;

a rotation speed setting portion configured to set an upper limit value of a rotation speed of the motor based on a comparison result of the temperature comparing portion; and a rotation speed control portion configured to control such that a rotation speed of the motor does not exceed the upper limit value set by the rotation speed setting portion.

It is preferable that, when a predetermined setting condition including at least a condition that the detected temperature is higher than the first temperature is satisfied, the rotation speed setting portion sets the upper limit value to a first upper limit value lower than a second upper limit value set by the rotation speed setting portion when the setting condition is not satisfied.

It is preferable that the rotation speed control portion performs a control such that the motor rotates at a target rotation speed that does not exceed the upper limit value, and the first upper limit value is lower than the second upper limit value by a predetermined value.

It is preferable that the setting condition include a condition that a state in which the detected temperature is higher than the first temperature continues for a predetermined first period of time.

It is preferable that, when a predetermined release condition including at least a condition that the detected temperature is lower than a second temperature lower than the first temperature is satisfied in a state where the upper limit value is set at the first upper limit value, the rotation speed setting portion set the upper limit value to a value higher than the first upper limit value.

It is preferable that the release condition include a condition that a state in which the detected temperature is lower than the second temperature continues for a predetermined second period of time.

It is preferable that the temperature sensor is disposed on a circuit board equipped in the motor device, and the temperature sensor is disposed at a position separated from a heat-generating component of the motor device by a predetermined distance or more.

It is preferable that the motor drive control apparatus further include:

a temperature analysis portion configured to correct an influence of heat from a heat-generating component with respect to the measurement result of the temperature sensor to output the corrected temperature as the detected temperature.

It is preferable that the motor drive control apparatus further include:

at least one of a current monitoring portion configured to monitor a current flowing through the motor and a voltage monitoring portion configured to monitor a power supply voltage applied to the motor device, in which the rotation speed setting portion set the upper limit value based on the comparison result of the temperature comparing portion and at least one of a monitoring result of the current monitoring portion and a monitoring result of the voltage monitoring portion.

It is preferable that the non-heat-generating component is an impeller.

One aspect of the disclosure provides a fan including:
a motor;
a motor drive control apparatus that controls a motor driving; and
an impeller coupled to the motor,
in which the motor drive control apparatus includes:
a temperature sensor that measures a temperature correlated with a temperature of the impeller;
a temperature comparing portion configured to compare a detected temperature based on a measurement result of the temperature sensor with a predetermined first temperature higher than a highest value of a design temperature of the fun;
a rotation speed setting portion configured to set an upper limit value of a rotation speed of the motor based on a comparison result of the temperature comparing portion; and
a rotation speed control portion configured to control such that a rotation speed of the motor does not exceed the upper limit value set by the rotation speed setting portion.

One aspect of the disclosure provides a motor control method which is performed in a motor drive control apparatus mounted on a motor device including a motor and a non-heat-generating component coupled to the motor, the method including the steps of:
measuring a temperature correlated with a temperature of the non-heat-generating component;
comparing a detected temperature based on a measurement result with a predetermined first temperature higher than a highest value of a design temperature of the motor device;
setting an upper limit value of a rotation speed of the motor based on a comparison result; and
controlling such that a rotation speed of the motor does not exceed the upper limit value.

According to these disclosures, it is possible to provide the motor drive control apparatus, the fan, and the motor control method capable of reducing the possibility of occurrence of an abnormal state in a non-heat-generating component.

DETAILED DESCRIPTION

Hereinafter, a fan according to an embodiment of the disclosure will be described.

In the following description, a "design temperature" set for a motor device such as a fan refers to a temperature range from the highest value to the lowest value, which is designed in order that components of the motor device work safely. That is, the design temperature can be said to be a temperature range in which the operation is guaranteed for the motor device, or the design temperature can be said to be a temperature range (usable temperature range) in which the motor device is supposed to be used. Further, a "non-heat-generating component" used for a part of a device hardly generates heat when the device operates. On the other hand, a "heat-generating component" used for a part of a device has a possibility of generating heat when the device operates.

[First Embodiment]

Figure 1:
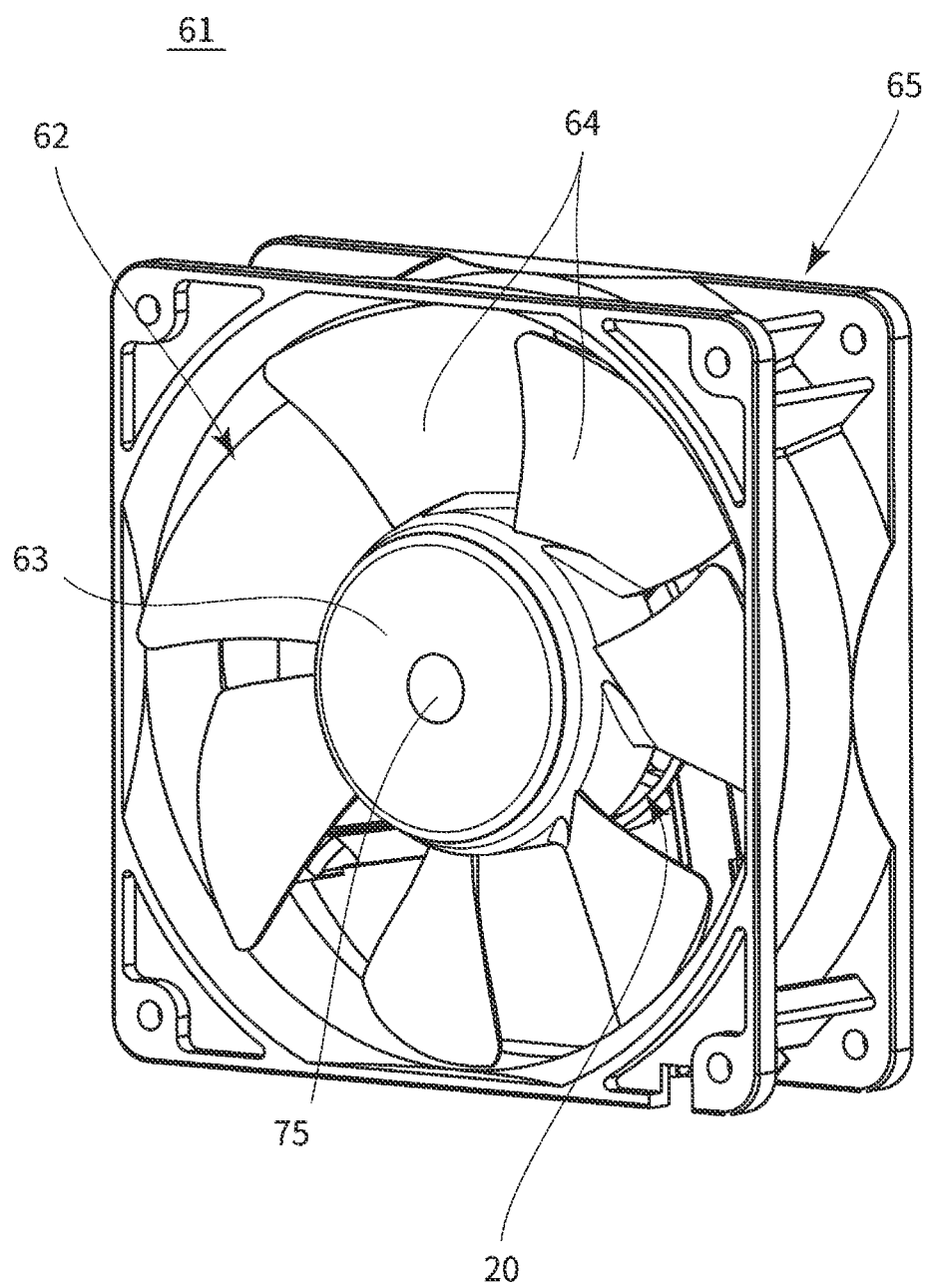
FIG. 1 is a perspective view illustrating a fan according to a first embodiment of the disclosure.

FIG. 1 is a perspective view illustrating a fan (an example of a motor device) 61 according to a first embodiment of the disclosure.

The fan 61 can be said to be a motor device using a motor 20. As illustrated in FIG. 1, the fan 61 has the motor 20, an impeller 62 which is a non-heat-generating component joined to the motor 20, and a case 65 which surrounds the impeller 62. The impeller 62 is joined to the motor 20 so as to rotate about a rotation shaft 75 and has a hub 63 attached to the rotation shaft 75 and a plurality of blades 64 arranged circumferentially around the hub 63. The fan 61 is, for example, an axial fan.

Figure 2:
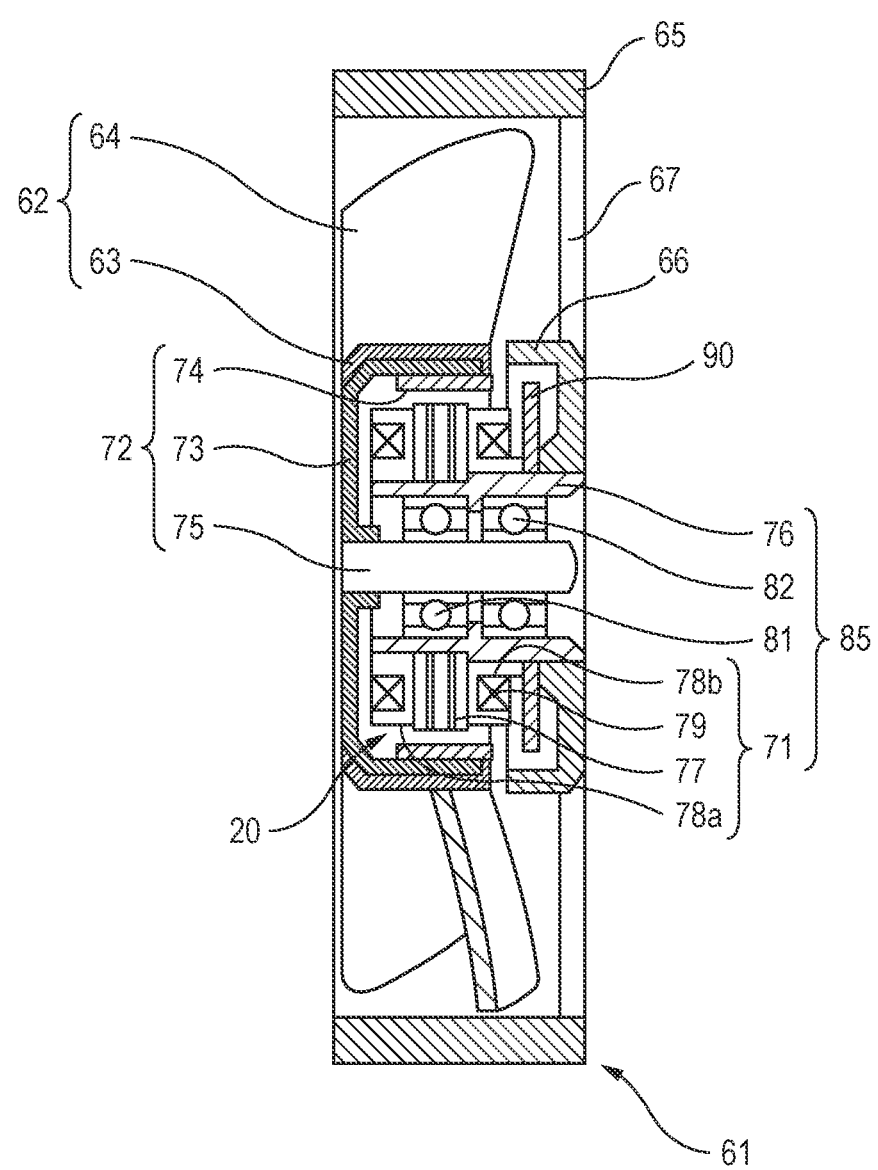
FIG. 2 is a side cross-sectional view of the fan.

FIG. 2 is a side cross-sectional view of the fan 61.

As illustrated in FIG. 2, the case 65 has a motor base portion 66 and a spoke portion 67 for supporting the motor base portion 66, in addition to a portion which surrounds a lateral circumferential portion of the impeller 62 over the entire circumference. A lead wire (not illustrated) is wired along the spoke portion 67 in the spoke portion 67 and electric power is supplied from the outside to the motor 20 through the lead wire.

The motor 20 is, for example, an outer-rotor-type three-phase brushless DC motor. The motor 20 is mounted on the motor base portion 66. The motor 20 has a rotor 72 and a stator portion 85.

The rotor 72 has a rotor yoke 73, a magnet 74, and the rotation shaft 75.

The rotor yoke 73 is a cup-shaped member which is made of a soft magnetic material such as iron and opens downward. The magnet 74 has a ring shape. The magnet 74 is fixed to an inner peripheral surface of the rotor yoke 73. The rotation shaft 75 is made of, for example, iron. The rotation shaft 75 is attached to an upper surface of the rotor yoke 73 so as to protrude downward. The rotation shaft 75 is joined to the rotor yoke 73 in a state where an upper end portion of the rotation shaft 75 is press-fitted into a center portion of the rotor yoke 73.

The hub 63 of the impeller 62 is fixed to an outer peripheral surface of the rotor yoke 73. The hub 63, for example, is adhered to the outer peripheral surface of the rotor yoke 73 by using an adhesive.

The stator portion 85 has a bearing holder 76, bearings 81 and 82, and a stator 71. The stator 71 has a stator core 77, an insulator 78 (an upper insulator 78a and a lower insulator 78b), and a coil 79.

The bearing holder 76 is fixed to the motor base portion 66. The stator 71 is attached to an outer peripheral surface of the bearing holder 76. The stator core 77 is mounted in a state where the stator core 77 is fitted to the outer periphery of the bearing holder 76. The upper insulator 78a is attached to the stator core 77 from above and the lower insulator 78b is attached to the stator core 77 from below. The stator core 77 is constituted by laminating a predetermined number of cores having a plurality of salient poles extending radially outward from an annular yoke portion in an axial direction. The insulator 78 consisting of the upper insulator 78a and the lower insulator 78b is mounted on the stator core 77. The coil 79 is attached to each of the salient poles of the stator core 77 in a state of being wound via the insulator 78.

On a lower side of the lower insulator 78b, a circuit board 90 is equipped with an outer peripheral portion of the bearing holder 76. A motor drive control apparatus 1 for driving the motor 20 is mounted on the circuit board 90. That is, electronic components, circuit patterns, and the likes constituting the motor drive control apparatus 1 are provided in the circuit board 90.

When the fan 61 is driven, the flow of air generated by the fan 61 scarcely hits the surface of the circuit board 90. As illustrated in FIG. 2, the circuit board 90 is accommodated in, for example, an inner portion of the fan 61 so that most of the surface thereof is not directly exposed due to the motor base portion 66, the rotor yoke 73, or the like. Further, the arrangement of the circuit board 90 is not limited to this.

Figure 3:
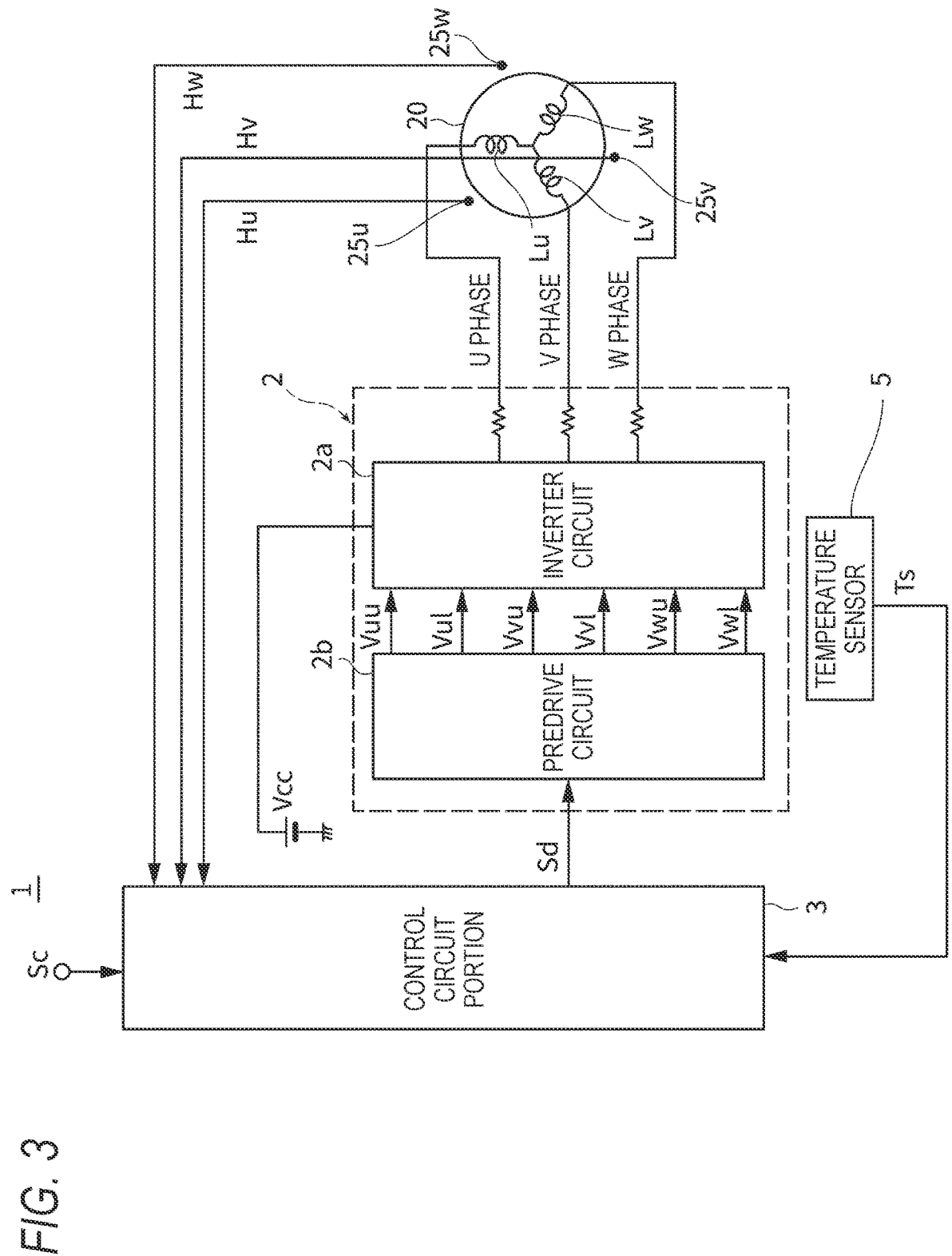
FIG. 3 is a diagram roughly illustrating a circuit configuration of a motor drive control apparatus.

FIG. 3 is a diagram roughly illustrating a circuit configuration of the motor drive control apparatus 1.

The motor drive control apparatus 1 drives the motor 20. In the embodiment, the motor 20 is, for example, a three-phase brushless motor. The motor drive control apparatus 1 rotates the motor 20 by periodically supplying a drive current to armature coils Lu, Lv, and Lw of the motor 20.

The motor drive control apparatus 1 has a motor drive portion 2, a control circuit portion 3, and a temperature sensor 5. The components of the motor drive control apparatus 1 illustrated in FIG. 3 are a part of the whole and the motor drive control apparatus 1 may have other components in addition to those illustrated in FIG. 1.

In the embodiment, the motor drive control apparatus 1 is an integrated circuit device (IC) in which a part (for example, the control circuit portion 3 and a predrive circuit 2b described below) thereof is packaged. Further, the entirety of the motor drive control apparatus 1 may be packaged as one integrated circuit device or all or a part of the motor drive control apparatus 1 may be packaged with other devices to constitute one integrated circuit device.

The motor drive portion 2 has an inverter circuit 2a and the predrive circuit 2b. The motor drive portion 2 outputs a drive signal to the motor 20 based on a drive control signal Sd output from the control circuit portion 3, to drive the motor 20.

The predrive circuit 2b generates an output signal for driving the inverter circuit 2a based on control by the control circuit portion 3 and outputs it to the inverter circuit 2a. The inverter circuit 2a outputs a drive signal to the motor 20 based on the output signal output from the predrive circuit 2b and energizes the armature coils Lu, Lv, and Lw of the motor 20. The inverter circuit 2a is constituted such that, for example, a pair of series circuits of two switching elements provided at both ends of a DC power supply Vcc are arranged for each phase (U phase, V phase, and W phase) of the armature coils Lu, Lv, and Lw. In each pair of the two switching elements, a terminal of each phase of the motor 20 is connected to a connection point between the switching elements (not illustrated). Based on the drive control signal Sd output from the control circuit portion 3 as described below, the predrive circuit 2b outputs, for example, six kinds of signals Vuu, Vul, Vvu, Vvl, Vwu, and Vwl corresponding to the respective switching elements of the inverter circuit 2a as output signals. By outputting those output signals, the switching elements corresponding to the respective output signals are turned on or off. Therefore, the driving signal is output to the motor 20 and electric power is supplied to each phase of the motor 20 (not illustrated).

The temperature sensor 5 is, for example, a thermistor. The temperature sensor 5 outputs a sensor output signal (an example of a measurement result of a temperature sensor) Ts according to a temperature measured by the temperature sensor 5. That is, the temperature sensor 5 measures the temperature of the surrounds thereof and outputs the sensor output signal Ts indicating the temperature.

Figure 4:
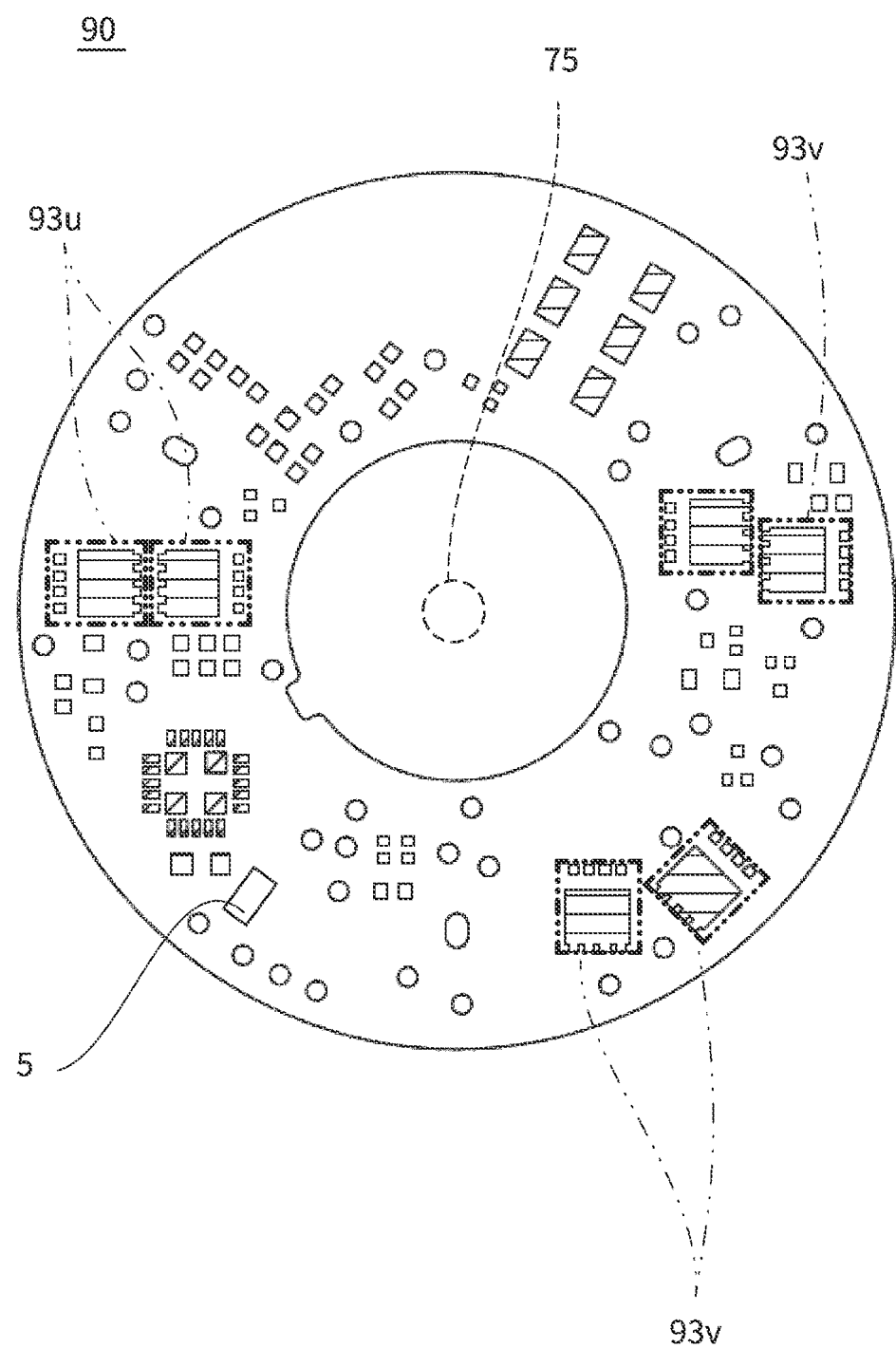
FIG. 4 is a diagram illustrating an example of a circuit board.

FIG. 4 is a diagram illustrating an example of the circuit board 90.

In FIG. 4, to simplify the explanation, electronic components constituting the motor drive control apparatus 1 are not illustrated and the shape of a resist arranged on the circuit board 90 is indicated by a solid line. Two-dot chain lines illustrated in FIG. 4 indicate positions where three sets of switching elements (an example of heat generating bodies) 93u, 93v, and 93w (a pair of switching elements 93u corresponding to the U phase, a pair of switching elements 93v corresponding to the V phase, and a pair of switching elements 93w corresponding to the W phase) constituting the inverter circuit 2a are mounted. Each of the switching elements 93u, 93v, and 93w is, for example, a Field Effect Transistor (FET) and generates heat with operation. That is, the respective switching elements 93u, 93v, and 93w are heat generating bodies in the fan 61.

The temperature sensor 5 is disposed on the circuit board 90 at a position separated from the respective switching elements 93u, 93v, and 93w by a predetermined distance or more. That is, the temperature sensor 5 is disposed at a position separated from the heat generating bodies in the fan 61 by a predetermined distance or more. In this case, the position separated from the heat generating bodies by a predetermined distance or more refers to a position which is relatively unlikely to be affected by heat from the heat-generating component and where it is possible to maintain the correlation between the temperature of the temperature sensor 5 and the temperature of the non-heat-generating component to be described below. In other words, the temperature sensor 5 is disposed on the circuit board 90 at a position separated from the respective switching elements 93u, 93v, and 93w by a predetermined distance or more, which is a position that is relatively unlikely to be affected by heat emitted from the respective switching elements 93u, 93v, and 93w and where the correlation between the temperature of the temperature sensor 5 and the temperature (as a specific example, the temperature of the impeller 62) of the non-heat-generating component can be maintained.

The temperature sensor 5 has a temperature which is lower than the temperatures of the heat generating bodies such as the switching elements 93u, 93v, and 93w and is close to the ambient temperature at which the fan 61 is used. The temperature of the temperature sensor 5 changes as the ambient temperature changes. Also, the temperature of the impeller 62 of fan 61 also changes as the ambient temperature changes. That is, the temperature of the temperature sensor 5 correlates with the temperature of the impeller 62. Therefore, the temperature sensor 5 measures the temperature correlated with the temperature of the impeller 62. The measurement result of the temperature sensor 5 is output as the sensor output signal Ts.

In the embodiment, since the temperature sensor 5 is disposed on the circuit board 90 which air flow hardly hits during operation of the fan 61, the temperature of the temperature sensor 5 is not easily affected by the air flow. Therefore, since the temperature measured by the temperature sensor 5 is easily maintained at a temperature corresponding to the ambient temperature, the temperature of the impeller 62 and the temperature sensor 5 have a high correlation. Further, potting may be performed on the temperature sensor 5 so that the temperature of the temperature sensor 5 is not affected by the ambient air flow.

Returning to FIG. 3, a speed command signal Sc and the sensor output signal Ts are input to the control circuit portion 3. The control circuit portion 3 performs drive control of the motor 20 based on those signals.

The speed command signal Sc is input from, for example, the outside of the control circuit portion 3. The speed command signal Sc is a signal related to the rotation speed of the motor 20. The speed command signal Sc is, for example, a pulse width modulation (PWM) signal corresponding to a target rotation speed of the motor 20. In other words, the speed command signal Sc is information corresponding to a target value of the rotation speed of the motor 20. Further, a clock signal may be input as the speed command signal Sc.

Further, in the embodiment, three Hall signals (an example of position detection signals) Hu, Hv, and Hw are input from the motor 20 to the control circuit portion 3. The Hall signals Hu, Hv, and Hw are, for example, the outputs of three Hall (HALL) elements 25u, 25v, and 25w arranged in the motor 20. The Hall signals Hu, Hv, and Hw are signals corresponding to the rotation of the rotor 72 of the motor 20. The control circuit portion 3 uses the Hall signals Hu, Hv, and Hw to detect the rotation state of the motor 20 and controls the driving of the motor 20. That is, the control circuit portion 3 obtains actual rotation speed information on the actual rotation speed of the rotor 72 of the motor 20 using the Hall signals Hu, Hv, and Hw and controls the driving of the motor 20. In addition, the control circuit portion 3 detects a rotational position of the rotor 72 of the motor 20 using the Hall signals Hu, Hv, and Hw and controls the driving of the motor 20.

The three Hall elements 25u, 25v, and 25w (hereafter, those may be collectively referred to as Hall element 25) are disposed, for example, around a rotor of the motor 20 at substantially equal intervals (at intervals of 120 degrees with adjacent ones). The Hall elements 25u, 25v, and 25w detect the magnetic poles of the rotor 72 and output the Hall signals Hu, Hv, and Hw, respectively.

It may be configured such that other information on a rotation state of the motor 20 is input to the control circuit portion 3, in addition to the Hall signals Hu, Hv, and Hw. For example, a signal (pattern FG) generated using a coil pattern provided on the substrate on the side of the rotor may be input as an FG signal corresponding to the rotation of the rotor of the motor 20. Further, it may be configured such that the rotation state of the motor 20 is detected based on a detection result of a rotational position detection circuit for detecting a counter electromotive force induced in each phase (U, V or W phase) of the motor 20. An encoder, a resolver, or the like may be provided whereby information on the rotation speed and the like of the motor 20 is detected by the encoder or the resolver.

The control circuit portion 3 is constituted of, for example, a microcomputer, a digital circuit, or the like. The control circuit portion 3 outputs the drive control signal Sd for driving the motor 20 based on the input signal. Specifically, the control circuit portion 3 outputs the drive control signal Sd to the predrive circuit 2b based on the Hall signals Hu, Hv, and Hw, the speed command signal Sc, and the sensor output signal Ts.

By outputting the drive control signal Sd, the control circuit portion 3 performs rotation control of the motor 20 so that the motor 20 rotates at a rotation speed corresponding to the speed command signal Sc. That is, the control circuit portion 3 outputs the drive control signal Sd for driving the motor 20 to the motor drive portion 2 and performs rotation control of the motor 20. The motor drive portion 2 outputs a drive signal to the motor 20 based on the drive control signal Sd to drive the motor 20.

Figure 5:
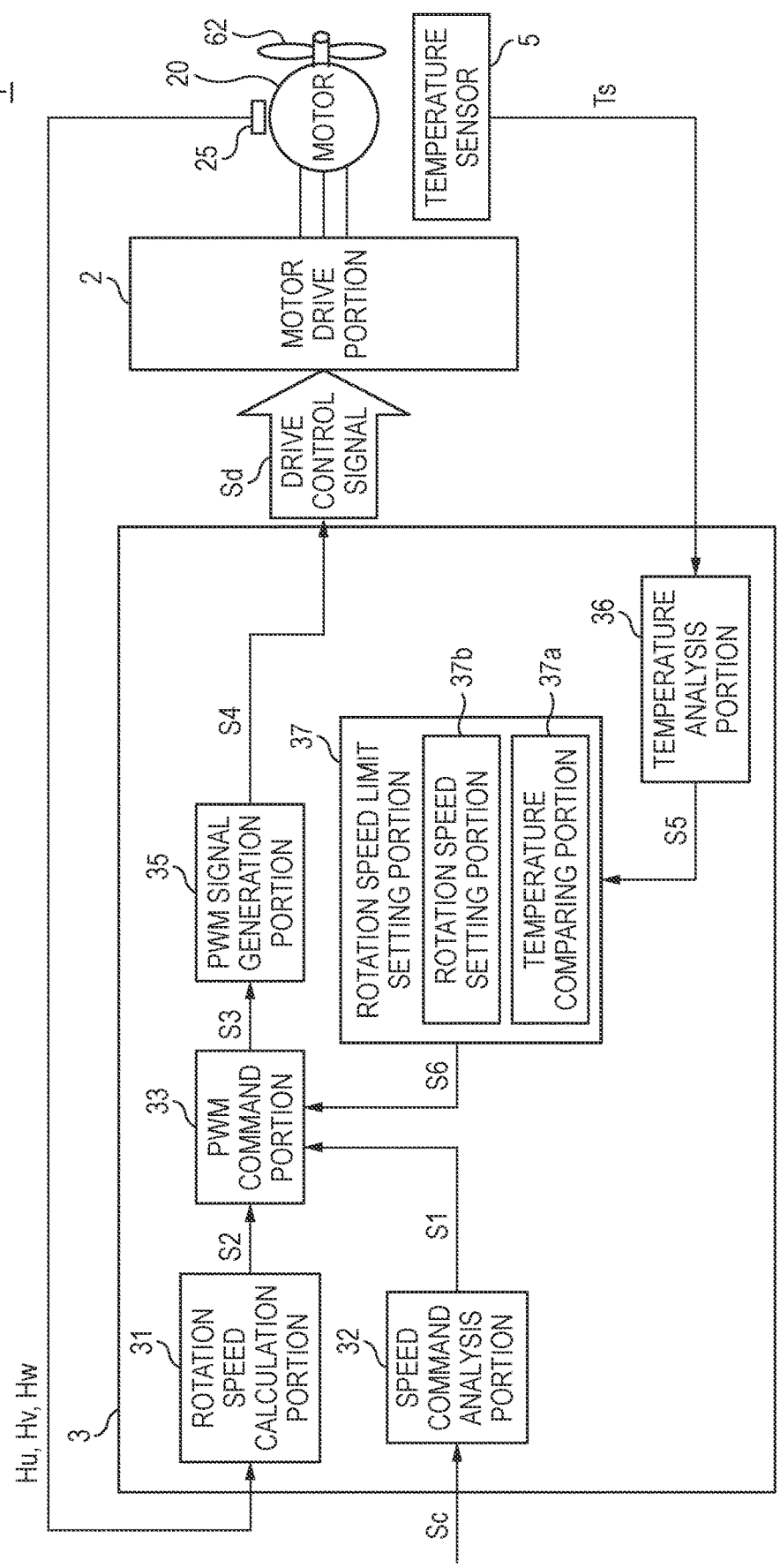
FIG. 5 is a block diagram illustrating a configuration of a control circuit portion.

FIG. 5 is a block diagram illustrating the configuration of the control circuit portion 3.

As described below, the control circuit portion 3 has a temperature analysis portion 36 which corrects the influence of heat from the heat-generating component with respect to the temperature measured by the temperature sensor 5 to output the corrected temperature as a detected temperature information S5 (hereinafter, may be simply referred to as a detected temperature S5), a rotation speed limit setting portion 37 which compares the detected temperature S5 based on the measurement result of the temperature sensor 5 with a predetermined first temperature higher than the highest value of the design temperature of the fan 61 and sets an upper limit value of the rotation speed of the motor 20 based on the comparison result, and a PWM command portion (an example of rotation speed control portion) 33 which performs control so that the rotation speed of the motor 20 does not exceed the upper limit value set by the rotation speed limit setting portion 37. To perform control of the motor 20, the control circuit portion 3 performs a temperature measurement step for measuring the temperature correlated with the temperature of the impeller 62 by the temperature sensor 5, a temperature comparison step for comparing the detected temperature S5 based on the measurement result of the temperature sensor 5 with the predetermined first temperature higher than the highest value of the design temperature of the fan 61, a rotation speed setting step for setting the upper limit value of the rotation speed of the motor 20 based on the comparison result, and a rotation speed control step for performing control so that the rotation speed of the motor 20 does not exceed the upper limit value set by the rotation speed limit setting portion 37.

That is, as illustrated in FIG. 5, the control circuit portion 3 has a rotation speed calculation portion 31, a speed command analysis portion 32, the PWM command portion 33, a PWM signal generation portion 35, the temperature analysis portion 36, and the rotation speed limit setting portion 37. The rotation speed limit setting portion 37 includes a temperature comparing portion 37a for comparing the detected temperature S5 based on the measurement result of the temperature sensor 5 with the above first temperature, and a rotation speed setting portion 37b for setting the upper limit value of the rotation speed of the motor 20 based on the comparison result of the temperature comparing portion 37a.

The Hall signals Hu, Hv, and Hw are input to the rotation speed calculation portion 31. The rotation speed calculation portion 31 outputs a position signal indicating the positional relationship between each phase and the rotor 72 based on the input Hall signals Hu, Hv, and Hw. In addition, the rotation speed calculation portion 31 generates and outputs actual rotation speed information corresponding to the period of the position signal based on the Hall signals Hu, Hv, and Hw. That is, the rotation speed calculation portion 31 outputs the actual rotation speed information on the actual rotation speed of the rotor 72 of the motor 20. In FIG. 5, an actual rotation signal S2 is illustrated by combining the position signal and the actual rotation speed information. The actual rotation signal S2 is output to the PWM command portion 33.

The speed command signal Sc is input to the speed command analysis portion 32. The speed command analysis portion 32 outputs a target rotation speed signal S1 (hereinafter, may be simply referred to as a target rotation speed S1) indicating the target rotation speed of the motor 20 based on the speed command signal Sc. The target rotation speed S1 is a PWM signal indicating the duty ratio corresponding to the speed command signal Sc. The target rotation speed S1 is output to the PWM command portion 33.

The actual rotation signal S2 output from the rotation speed calculation portion 31 and the target rotation speed S1 corresponding to the speed command signal Sc output from the speed command analysis portion 32 are input to the PWM command portion 33. When the target rotation speed S1 corresponding to the speed command signal Sc exceeds the upper limit value set by the rotation speed setting portion 37b of the rotation speed limit setting portion 37, the PWM command portion 33 sets the target rotation speed S1 to the upper limit value. The PWM command portion 33 outputs a PWM setting instruction signal S3 based on the actual rotation signal S2, that is, the position signal and the actual rotation speed information, and the target rotation speed S1. The PWM setting instruction signal S3 is information indicating the duty ratio for outputting the drive control signal Sd. The PWM setting instruction signal S3 is output to the PWM signal generation portion 35.

The PWM command portion 33 compares the target rotation speed S1 with the actual rotation speed information corresponding to the rotation speed of the motor 20 and generates the PWM setting instruction signal S3 so that the rotation speed of the motor 20 corresponds to the target rotation speed S1.

The PWM setting instruction signal S3 is input to the PWM signal generation portion 35. The PWM signal generation portion 35 generates a PWM signal S4 for driving the motor drive portion 2 based on the PWM setting instruction signal S3. The PWM signal S4 is, for example, a signal of which the duty ratio is the same as that of the PWM setting instruction signal S3. In other words, the PWM signal S4 is a signal having a duty ratio corresponding to the PWM setting instruction signal S3.

The PWM signal S4 output from the PWM signal generation portion 35 is output from the control circuit portion 3 to the motor drive portion 2 as the drive control signal Sd. Therefore, a drive signal is output from the motor drive portion 2 to the motor 20 and the motor 20 is driven.

Here, the PWM command portion 33 performs the above-described control so that the motor 20 rotates at the target rotation speed S1 which does not exceed the upper limit value of the rotation speed of the motor 20. In other words, the PWM command portion 33 limits the target rotation speed S1 so as not to exceed the upper limit value.

In the embodiment, the upper limit value is set to either a steady upper limit rotation speed (second upper limit value) in a normal state or a limited rotation speed (first upper limit value) lower than the steady upper limit rotation speed by a predetermined value. The PWM command portion 33 is set in advance so as to perform control with either the steady upper limit rotation speed or the limited rotation speed as the upper limit value. In other words, the PWM command portion 33 is set in advance such that either the rotation speed control in which the steady upper limit rotation speed in a normal state is set as the upper limit value of the rotation speed or the control in which the rotation speed is limited by setting (setting the limited rotation speed as the upper limit value) a rotation speed lower than that of the normal state as the upper limit value is performed.

The PWM command portion 33 switches whether to set the steady upper limit rotation speed as the upper limit value of the rotation speed or to set the limited rotation speed as the upper limit value of the rotation speed based on a rotation speed limiting signal S6 output from the rotation speed limit setting portion 37. That is, in the embodiment, the rotation speed limiting signal S6 is a signal (for example, it may be a value of a flag set in a register or the like or may be a voltage value of a predetermined level) for switching the upper limit value of the rotation speed and the rotation speed limit setting portion 37 sets the upper limit value of the rotation speed of the motor 20 by outputting the rotation speed limiting signal S6. For example, either a steady control signal for setting the steady upper limit rotation speed as the upper limit value of the rotation speed or an upper limit restriction signal for setting the limited rotation speed as the upper limit value of the rotation speed is output as the rotation speed limiting signal S6.

When a predetermined setting condition including at least the fact that the detected temperature S5 is higher than the first temperature is satisfied as described below, the rotation speed limit setting portion 37 sets the upper limit value of the rotation speed to a value lower than that when the setting condition is not satisfied. Further, when a predetermined release condition including at least the fact that the detected temperature S5 is lower than the second temperature lower than the first temperature is satisfied in a state where setting of the upper limit value of the rotation speed is performed because the setting condition is satisfied, the rotation speed limit setting portion 37 sets the upper limit value of the rotation speed to a value higher than that when the setting condition is satisfied. In the embodiment, when the setting condition is satisfied, the rotation speed limit setting portion 37 outputs a rotation speed limiting signal S6 (upper limit restriction signal) for setting the limited rotation speed lower than the steady upper limit rotation speed to the upper limit value of the rotation speed. Further, when the release condition is satisfied in a state where the upper limit value of the rotation speed is set at the limited rotation speed, the rotation speed limit setting portion 37 outputs the rotation speed limiting signal S6 (steady control signal) for setting the upper limit value of the rotation speed to the steady upper limit rotation speed.

In the embodiment, the rotation speed limit setting portion 37 sets, as the upper limit value of the rotation speed, the rotation speed lower by a predetermined value than the maximum target rotation speed at which the motor 20 can rotate when the setting condition is not satisfied. That is, the steady upper limit rotation speed can be said to be the maximum target rotation speed at which the motor 20 can rotate when the setting condition is not satisfied. The limited rotation speed is a rotation speed lower than the steady upper limit rotation speed, that is, the maximum target rotation speed by a predetermined value.

In the embodiment, the setting condition is that a state in which the detected temperature S5 is higher than the first temperature continues for a predetermined first period of time T1. In addition, the release condition is that a state where the detected temperature S5 is lower than the second temperature continues for a predetermined second period of time T2. The first temperature is higher than the second temperature by a predetermined temperature (V degrees). That is, the setting condition and the release condition constitute a so-called Schmidt trigger for the detected temperature S5. In other words, it can be said that hysteresis is provided for the setting condition and the release condition. Further, each of the setting condition and the release condition includes a condition related to time, and thus switching between a state where the setting condition is satisfied and a state where the release condition is satisfied does not frequently occur. Therefore, the setting state of the upper limit value of the rotation speed is stabilized and the driving state of the motor 20 can be stabilized.

The temperature analysis portion 36 receives the sensor output signal Ts output from the temperature sensor 5, that is, information on the temperature measured by the temperature sensor 5. The temperature analysis portion 36 has preset information (this may be, for example, information for calculating the temperature by a mathematical expression, information for specifying the temperature to be output by a lookup table, or other information) on the temperature to be output as the detected temperature S5 corresponding to the measurement result of the temperature sensor 5. Based on the sensor output signal Ts, the temperature analysis portion 36 outputs the detected temperature S5 based on the preset information. In this case, the relationship between the sensor output signal Ts and the detected temperature S5 is based on the correlation between the temperature measured by the temperature sensor 5 and the temperature of the impeller 62 at that time. That is, the detected temperature S5 can be said to be an estimated value of the temperature of the impeller 62.

Figure 6:
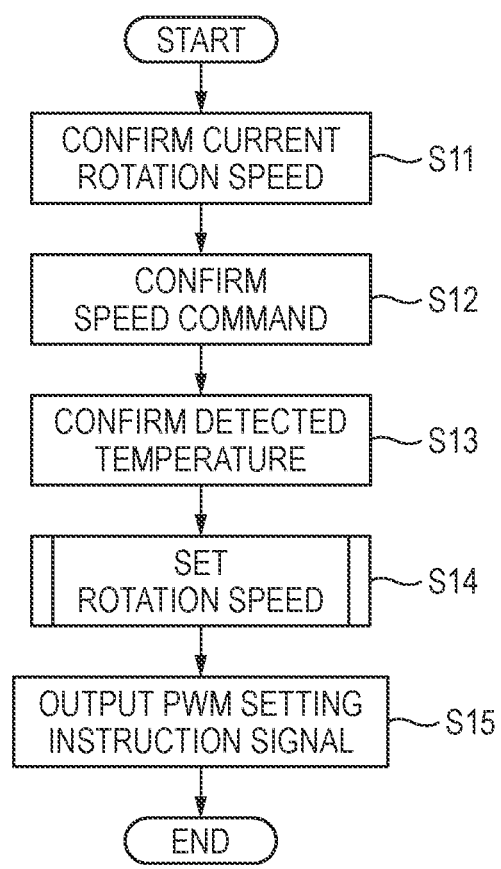
FIG. 6 is a flowchart illustrating an example of a processing operation performed by the control circuit portion.

FIG. 6 is a flowchart illustrating an example of a processing operation performed by the control circuit portion 3.

As illustrated in FIG. 6, the control circuit portion 3 performs control to set the rotation speed based on the input signal and outputs the PWM setting instruction signal S3 from the PWM command portion 33 to the PWM signal generation portion 35. By outputting the PWM setting instruction signal S3 in this manner, the control circuit portion 3 outputs the drive control signal Sd based on the PWM setting instruction signal S3 to the motor drive portion 2 and controls the driving of the motor 20. The process illustrated in FIG. 6 is repeatedly executed during the operation of the motor drive control apparatus 1. The process illustrated in FIG. 6 is executed, for example, every predetermined number of clocks.

As illustrated in FIG. 6, in Step S11, the PWM command portion 33 confirms an actual current rotation speed of the motor 20 based on the actual rotation signal S2.

In Step S12, the PWM command portion 33 confirms the target rotation speed S1. That is, the PWM command portion 33 confirms a speed command input as the speed command signal Sc.

In Step S13, the rotation speed limit setting portion 37 confirms the detected temperature S5 output from the temperature analysis portion 36.

In Step S14, the rotation speed limit setting portion 37 and the PWM command portion 33 perform a rotation speed setting process as described below. Therefore, a PWM setting value is calculated.

In Step S15, the PWM command portion 33 outputs the PWM setting instruction signal S3 corresponding to the PWM setting value calculated by the rotation speed setting process.

When the processing of Step S15 is finished, a series of processing is finished.

Figure 7:
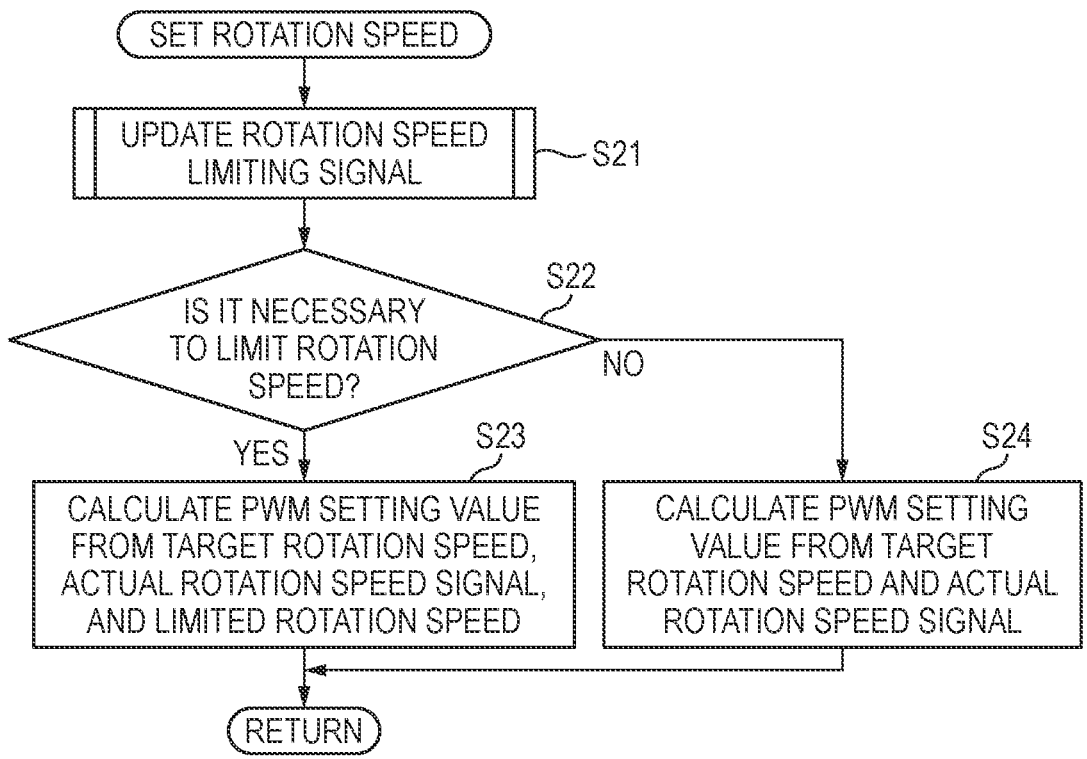
FIG. 7 is a flowchart illustrating a rotation speed setting process.

FIG. 7 is a flowchart illustrating the rotation speed setting process.

In the rotation speed setting process of the embodiment, a process (that is, a process related to the setting of the rotation number restriction) related to the setting of the upper limit value of the rotation speed which is performed by the rotation speed limit setting portion 37 and a process (a process for calculating the PWM setting value corresponding to the rotation speed) for setting the rotation speed which is performed by the PWM command portion 33 are performed.

That is, as illustrated in FIG. 7, when the rotation speed setting process starts as illustrated in FIG. 7, the rotation speed limit setting portion 37 performs an update process of the rotation speed limiting signal S6 in Step S21. That is, the rotation speed limit setting portion 37 performs a process of updating a flag related to the setting of the upper limit value of the rotation speed. Therefore, the updated rotation speed limiting signal S6 is input to the PWM command portion 33.

In Step S22, the PWM command portion 33 determines whether (that is, whether it is necessary to lower the upper limit value of the rotation speed than in the steady state) it is necessary to limit the rotation speed than in the steady state based on the rotation speed limiting signal S6 input. In other words, the PWM command portion 33 sets the upper limit value of the rotation speed to either the steady upper limit rotation speed or the limited rotation speed based on the rotation speed limiting signal S6 input. When it is determined that it is necessary to limit the rotation speed (YES) (that is, when the upper limit value of the rotation speed is set at the limited rotation speed), the PWM command portion 33 proceeds to Step S23 and when it is determined that it is not necessary to limit the rotation speed (NO) (that is, when the upper limit value of the rotation speed is set at the steady upper limit rotation speed), the PWM command portion 33 proceeds to Step S24.

In Step S23, the PWM command portion 33 calculates the PWM setting value based on the target rotation speed S1, the actual rotation signal S2, and the limited rotation speed. That is, in this case, regardless of the value of the target rotation speed S1, the rotation speed is determined with the limited rotation speed as the upper limit and the PWM setting value is calculated.

On the other hand, in Step S24, the PWM command portion 33 calculates the PWM setting value based on the target rotation speed S1, the actual rotation signal S2, and the steady upper limit rotation speed. In the embodiment, the steady upper limit rotation speed is the maximum target rotation speed (for example, the rotation speed corresponding to a case where the duty ratio is 100% when the speed command signal Sc is the PWM signal) at which the motor 20 can rotate when the setting condition is not satisfied. Therefore, in this case, the rotation speed is determined based on the target rotation speed S1 and the actual rotation signal S2 such that the motor 20 rotates at the target rotation speed S1, and the PWM setting value is calculated.

The PWM setting value set in the PWM command portion 33 is recorded in a PWM setting register referred to by the PWM command portion 33 and the PWM command portion 33 outputs the PWM setting instruction signal S3 based on the PWM setting value recorded in the PWM setting register. However, it is not limited thereto.

Figure 8:
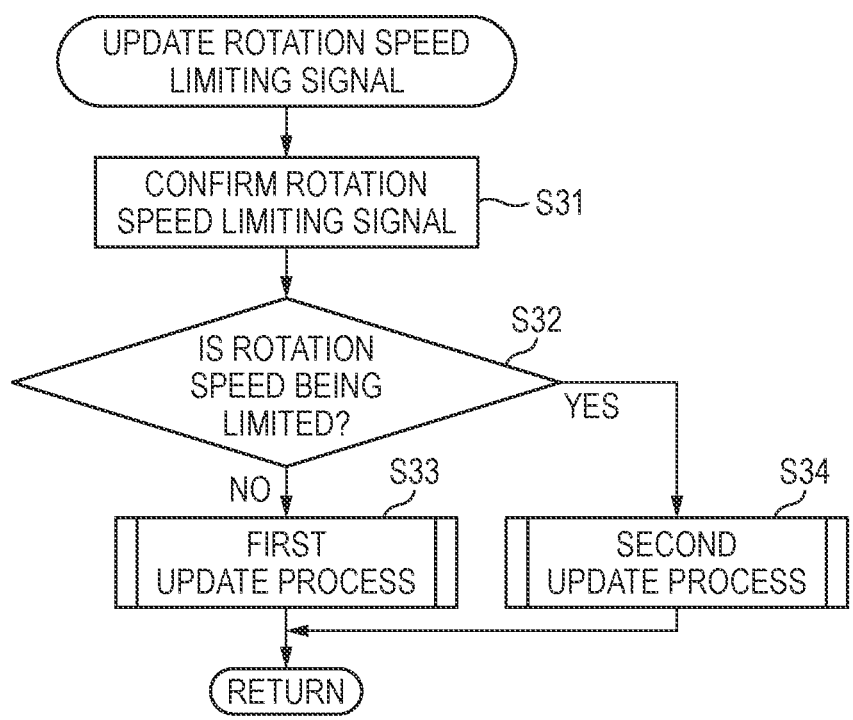
FIG. 8 is a flowchart illustrating a process of updating a rotation speed limiting signal.

FIG. 8 is a flowchart illustrating an update process of the rotation speed limiting signal.

As illustrated in FIG. 8, in Step S31, the rotation speed limit setting portion 37 confirms the state of the current rotation speed limiting signal S6.

In Step S32, the rotation speed limit setting portion 37 determines whether (that is, whether the steady control signal is output as the rotation speed limiting signal S6 or the upper limit restriction signal is output) the rotation speed is being limited. When (when the steady control signal is output; NO) the rotation speed is not limited, the process proceeds to Step S33. When (when the upper limit restriction signal is output; YES) the rotation speed is limited, the process proceeds to Step S34.

In Step S33, the rotation speed limit setting portion 37 performs a first update process as described below.

On the other hand, in Step S34, the rotation speed limit setting portion 37 performs a second update process as described below.

Figure 9:
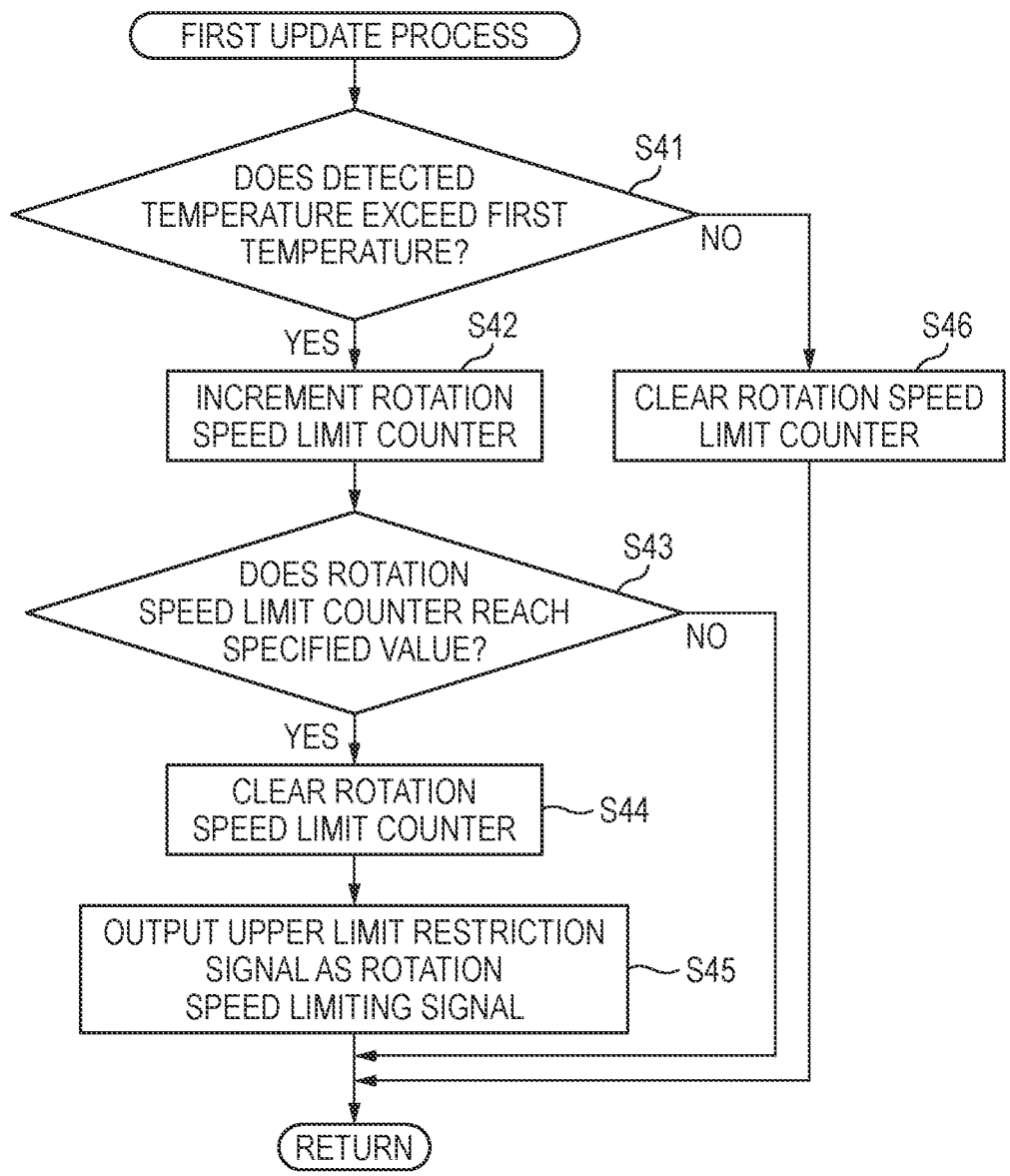
FIG. 9 is a flowchart illustrating a first update process.

FIG. 9 is a flowchart illustrating the first update process.

As illustrated in FIG. 9, in Step S41, the rotation speed limit setting portion 37 compares the detected temperature S5 with the first temperature and determines whether the detected temperature S5 exceeds the first temperature. When the detected temperature S5 exceeds the first temperature (YES), the process proceeds to Step S42.

In Step S42, the rotation speed limit setting portion 37 increments a rotation speed limit counter.

In Step S43, the rotation speed limit setting portion 37 determines whether the rotation speed limit counter reaches a predetermined value. When the rotation speed limit counter reaches the predetermined value (YES), the process proceeds to Step S44, and in the other case (NO), the first update process is finished. That is, since the rotation speed setting process is performed every predetermined number of clocks, when the detected temperature S5 exceeds the first temperature for the predetermined first period of time T1 (time until the rotation speed limit counter reaches the predetermined value) in a case where the rotation speed is not limited (when the setting condition is satisfied), the process proceeds to Step S44.

In Step S44, the rotation speed limit setting portion 37 clears the rotation speed limit counter.

In Step S45, the rotation speed limit setting portion 37 outputs an upper limit restriction signal as a rotation speed limiting signal S6. Therefore, in the PWM command portion 33, the upper limit value of the rotation speed is limited to the limited rotation speed and the PWM setting value is calculated.

On the other hand, when the detected temperature S5 does not exceed the first temperature in a case where the rotation speed is not limited (NO in Step S41), the rotation speed limit setting portion 37 clears the rotation speed limit counter in Step S46. Therefore, even when the detected temperature S5 exceeds the first temperature before the step and the rotation speed limit counter is counted, the rotation speed limit counter is cleared. Therefore, when the detected temperature S5 then exceeds the first temperature, the count (clocking of the time when the detected temperature S5 exceeds the first temperature) of the rotation speed limit counter starts from zero.

When the process of Step S45 or the process of Step S46 is performed, the process returns to the process of FIG. 8.

Figure 10:
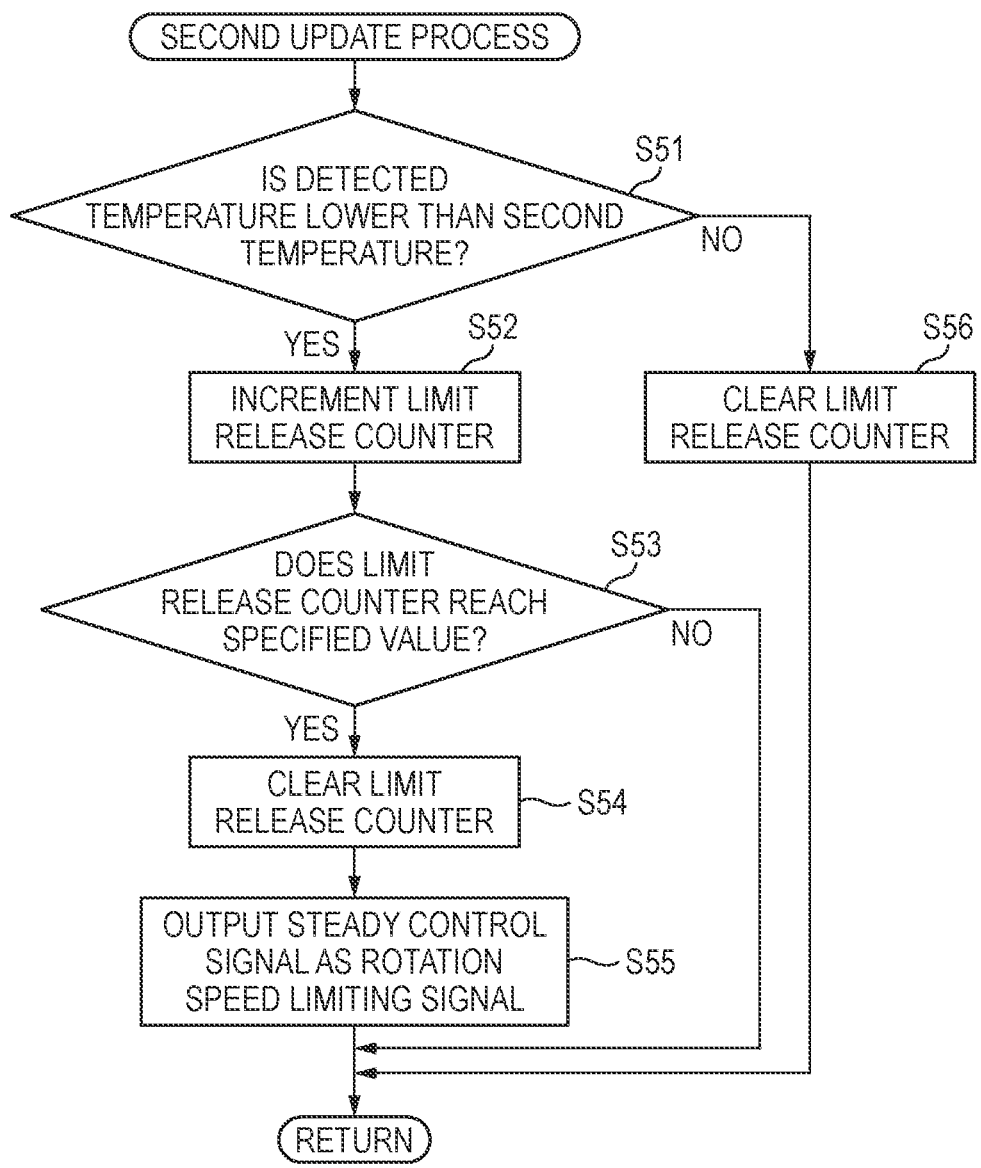
FIG. 10 is a flowchart illustrating a second update process.

FIG. 10 is a flowchart illustrating the second update process.

As illustrated in FIG. 10, in Step S51, the rotation speed limit setting portion 37 compares the detected temperature S5 with the second temperature and determines whether the detected temperature S5 is lower than the second temperature. When the detected temperature S5 is lower than the second temperature (YES), the process proceeds to Step S52.

In Step S52, the rotation speed limit setting portion 37 increments a limit release counter.

In Step S53, the rotation speed limit setting portion 37 determines whether the limit release counter reaches a predetermined value. When the limit release counter reaches the predetermined value (YES), the process proceeds to Step S54, and in the other case (NO), the second update process is finished. That is, since the rotation speed setting process is performed every predetermined number of clocks, when the detected temperature S5 is lower than the second temperature for the predetermined second period of time T2 (time until the limit release counter reaches the predetermined value) in a case where the rotation speed is not limited (when the release condition is satisfied), the process proceeds to Step S54.

In Step S54, the rotation speed limit setting portion 37 clears the limit release counter.

In Step S55, the rotation speed limit setting portion 37 outputs a steady control signal as the rotation speed limiting signal S6. Therefore, in the PWM command portion 33, the upper limit value of the rotation speed is set to the steady upper limit rotation speed (a state where limitation is performed compared to the normal state is released) and the PWM setting value is calculated.

On the other hand, when the detected temperature S5 is not lower than the second temperature in a case where the rotation speed is not limited (NO in Step S51), the rotation speed limit setting portion 37 clears the limit release counter in Step S56. Therefore, even when the detected temperature S5 is lower than the second temperature before the step and the limit release counter is counted, the limit release counter is cleared. Therefore, when the detected temperature S5 then becomes lower than the second temperature, the count (clocking of the time when the detected temperature S5 is lower than the second temperature) of the limit release counter starts from zero.

When the process of Step S55 or the process of Step S56 is performed, the process returns to the process of FIG. 8.

As described above, according to the embodiment, the upper limit value of the rotation speed of the motor 20 is limited based on the magnitude of the detected temperature S5. That is, when the predetermined setting condition is satisfied, the upper limit value of the rotation speed of the motor 20 is limited from the steady upper limit rotation speed in the normal state to the limited rotation speed lower than the steady upper limit rotation speed. Further, when the predetermined release condition is satisfied in a case where the upper limit value of the rotation speed is limited to the limited rotation speed as described above, the limitation on the upper limit value of the rotation speed is released and it is set to the steady upper limit rotation speed in the normal state.

Figure 11:
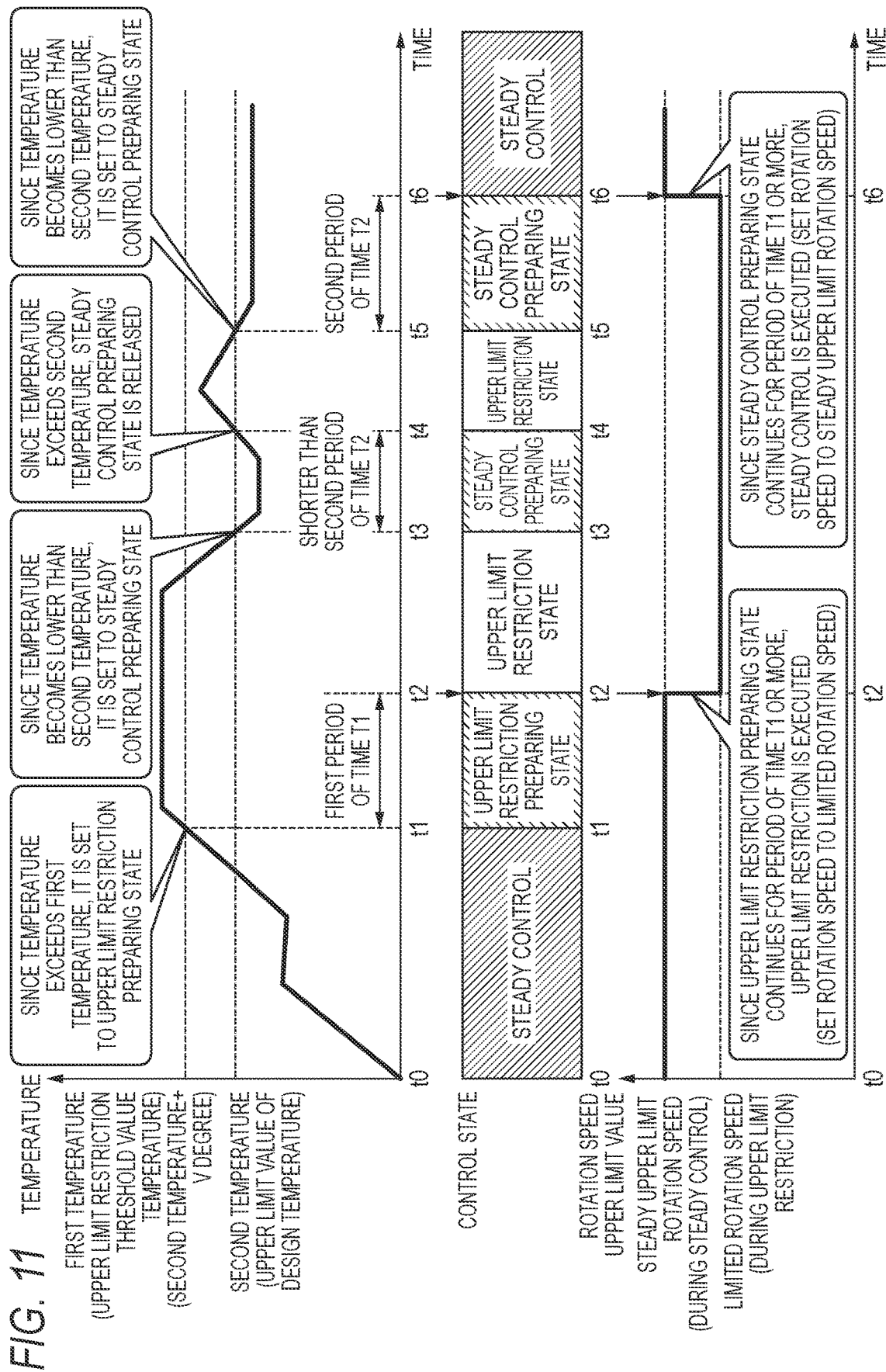
FIG. 11 is a diagram illustrating an example of transition of control performed by the motor drive control apparatus.

FIG. 11 is a diagram for explaining an example of transition of control performed by the motor drive control apparatus 1.

In FIG. 11, the transition of the detected temperature S5, the transition of the control state, and the transition of the upper limit value of the rotation speed are illustrated from the upper part. The second temperature is the highest value of the design temperature, and the first temperature is an upper limit restriction threshold value temperature. In addition, the upper limit value of the rotation speed in the normal state is the steady upper limit rotation speed and the upper limit value of the rotation speed in the upper limitation is the limited rotation speed.

As illustrated in FIG. 11, from a time t0 at which the driving of the motor 20 is started, the motor drive control apparatus 1 enters a steady control state. That is, the upper limit value of the rotation speed is the steady upper limit rotation speed and control is performed so that the motor 20 rotates at the target rotation speed S1.

The detected temperature S5 rises as the driving in the steady control state continues, and when the temperature exceeds the first temperature at a time t1, clocking (counting of the rotation speed limit counter) of the first period of time T1 is started. That is, the state is shifted to an upper limit restriction preparing state where the upper limit value of the rotation speed is set at the limited rotation speed when the state described above continues for the first period of time T1. When a state where the detected temperature S5 exceeds the first temperature as described above continues, the state is shifted to an upper limit restriction state at a time t2 at which the first period of time T1 has elapsed from the time t1. That is, the upper limit value of the rotation speed is switched to the limited rotation speed and control is performed so that the motor 20 rotates at the target rotation speed S1 within the range up to the limited rotation speed.

In the upper limit restriction state, when the detected temperature S5 falls and becomes lower than the second temperature at a time t3, clocking (counting of the limit release counter) of the second period of time T2 is started. That is, the state is shifted to a steady control preparing state where the limitation of the upper limit value is released when the state described above continues for the second period of time T2.

Here, when the detected temperature S5 exceeds the second temperature at a time t4 before the elapse of the second period of time T2 from time t3, the steady control preparing state is released and the state returns to an original control state, that is, the upper limit restriction state. That is, the control with the limited rotation speed as the upper limit value of the rotation speed is continued while the limitation on the upper limit value of the rotation speed is not released.

When the detected temperature S5 becomes lower than the second temperature at a time t5, the state is shifted to the steady control preparing state and clocking of the second period of time T2 is restarted. Then, when a state where the detected temperature S5 is lower than the second temperature as described above continues, the state is shifted to the steady control state at a time t6 at which the second period of time T2 has elapsed from the time t5. That is, the limitation on the rotation speed is released (with the steady upper limit rotation speed as the upper limit value of the rotation speed) and control is performed so that the motor 20 rotates at the target rotation speed S1.

As described above, according to the embodiment, when the environment in which the fan 61 is driven becomes a high temperature state or the like and the setting condition is satisfied, the upper limit value of the rotation speed of the motor 20 is limited from the steady upper limit rotation speed in the normal state to the limited rotation speed lower than the steady upper limit rotation speed. Therefore, it can be prevented that the impeller 62 is deformed or damaged by rotating the motor 20 at a high rotation speed under a high temperature environment. Specifically, in a case where, when the impeller 62 is rotated at, for example, a high rotation speed in a high temperature environment where the plasticity of the resin constituting the impeller 62 becomes high, there is a possibility that the blade 64 extends due to the action of the centrifugal force and interferes with the case 65 or the like, it is possible to prevent the blade 64 or the case 65 from being damaged by limiting the rotation speed. That is, it is possible to reduce the possibility of occurrence of an abnormal state in the non-heat-generating component. Further, even in a high temperature environment in which the rotation speed is limited as described above, the driving of the motor 20 can be continuously performed. Therefore, it is possible to expect that the fan 61 performs more than a certain function while preventing damage or the like of the impeller 62 even under a high temperature environment.

Since the temperature can be measured with using one temperature sensor 5 provided on the circuit board 90, the manufacturing cost of the fan 61 can be reduced. Further, since the rotation speed of the motor 20 is limited under such a high temperature environment, it is possible to thermally protect the heat generating bodies by utilizing one temperature sensor 5 without individually measuring each temperature of the individual heat generating bodies (heat generating elements such as the switching elements 93u, 93v, 93w, and the like) constituting the motor drive control apparatus 1.

By setting the first temperature to a temperature higher than the highest value of the design temperature of the motor 20, the motor 20 can be steadily driven within the design temperature. Since the steady rotation can be maintained with the steady upper limit rotation speed as the upper limit until the temperature environment reaches such a high temperature environment that the non-heat-generating component may be damaged or the like, a cooling capacity maintaining range of the fan 61 can be widened.

The limitation of the rotation speed is not performed until the detected temperature S5 exceeds the first temperature continuously for the first period of time T1. Therefore, a temperature addition amount from the highest value of the design temperature to the first temperature and an addition amount of the first period of time T1 can be made to correspond to a thermal stress capacity until an abnormal state of the non-heat-generating component occurs. Since it is possible to delay the time from the rise of the detected temperature S5 to the actual limitation of the rotation speed by a period corresponding to the thermal stress capacity, it is possible to ensure the cooling function of the fan 61 as high as possible.

Further, when the predetermined release condition is satisfied in a case where the upper limit value of the rotation speed is limited to the limited rotation speed as described above, the limitation on the upper limit value of the rotation speed is released and it is set to the steady upper limit rotation speed in the normal state. Therefore, when the impeller 62 is in a state where the possibility of being deformed or damaged is low, the drive can be made as normal. Release of the limitation on the upper limit value of the rotation speed is not performed until the state where the detected temperature S5 is lower than the second temperature continues for the second period of time T2. Therefore, it is possible to reliably secure time to surely return to a state where the temperature of the non-heat-generating component is lowered and the abnormal state is difficult to occur.

As described above, the temperature sensor 5 is disposed at a position separated from the heat-generating component by a predetermined distance or more in the fan 61. Therefore, it is possible to accurately measure the temperature correlated with an ambient temperature applied to the impeller 62 of the non-heat-generating component by excluding the effect of the rising temperature of the heat-generating component. The temperature measurement result of the temperature sensor 5 is corrected to the ambient temperature applied to the impeller 62 by the temperature analysis portion 36 and is set as the detected temperature S5. Therefore, it is possible to more accurately set the upper limit rotation speed.

The temperature sensor is not limited to a thermistor or the like provided in the circuit board 90 and a temperature sensor or the like provided in an integrated circuit constituting the control circuit portion 3 or the like may be used. In this case, the temperature measured by the temperature sensor and the temperature of the impeller 62 have a higher correlation by placing the integrated circuit at a position separated from a heat-generating component such as a switching element constituting the inverter circuit by a predetermined distance or more, so that it is possible to more effectively perform control to limit the upper limit of the rotation speed.

Regarding the predetermined condition and the release condition, the second temperature may be set to, for example, the highest value (which can be referred to as the highest value of the operation guarantee temperature which is the usable temperature range as described above) of the design temperature of the fan 61. The first temperature may be set to the upper limit restriction threshold value temperature which is higher than the highest value of the design temperature of the fan 61 by the determined temperature (V degree). The predetermined first period of time T1 and the second period of time T2 may be set to be long enough so that the change of the upper limit value of the rotation speed is not repeated when the fan 61 is used. The first period of time T1 and the second period of time T2 may have the same length or different lengths. The steady upper limit rotation speed can be set to the maximum target rotation speed as described above or may be set to a rotation speed greater than the maximum target rotation speed. The limited rotation speed may be a rotation speed smaller than the steady upper limit rotation speed by a predetermined amount (predetermined rotation speed or predetermined ratio) or may be a predetermined rotation speed set so as to be lower than the steady upper limit rotation speed as appropriate. The steady upper limit rotation speed may not be required to be set. In other words, the steady upper limit rotation speed may be set to infinity.

The first temperature, the first period of time T1, the second period of time T2, and the limited rotation speed can be set, for example, based on the result of a test or the like performed in advance. That is, those can be appropriately set in accordance with various factors such as the shape and material of the impeller 62, the rotation speed of the fan 61, the environment in which the fan 61 is used so that the impeller 62 does not deform or the fan 61 does not damaged as described below. The first temperature may be set based on the thermal influence (degree of deformation, expansion, or the like) of a non-heat-generating component such as the impeller 62, for example.

Further, in the embodiment described above, the upper limit value of the rotation speed is set to one of two values, but the disclosure is not limited thereto. The upper limit value of the rotation speed may be set to any one of three or more stages in accordance with the detected temperature S5. Further, when the upper limit value of the rotation speed is further limited than in the steady state, the control may be performed so that the rotation speed obtained by multiplying the target rotation speed S1 by a predetermined ratio becomes the upper limit value of the rotation speed. Further, the rotation speed limit setting portion 37 or the PWM command portion 33 may set the upper limit value calculated based on the detected temperature S5 as the upper limit value of the rotation speed. For example, the rotation speed limit setting portion 37 may calculate the upper limit value of the rotation speed based on the detected temperature S5 and may output the information on the upper limit value of the rotation speed to the PWM command portion 33 as the rotation speed limiting signal S6.

Further, the first period of time T1 and the second period of time T2 may be configured to vary in accordance with the detected temperature S5. When, for example, the temperature difference between the detected temperature S5 and the first temperature is large, the first period of time T1 may be made shorter than that when the temperature difference is small.

Description of Modification Example

Figure 12:
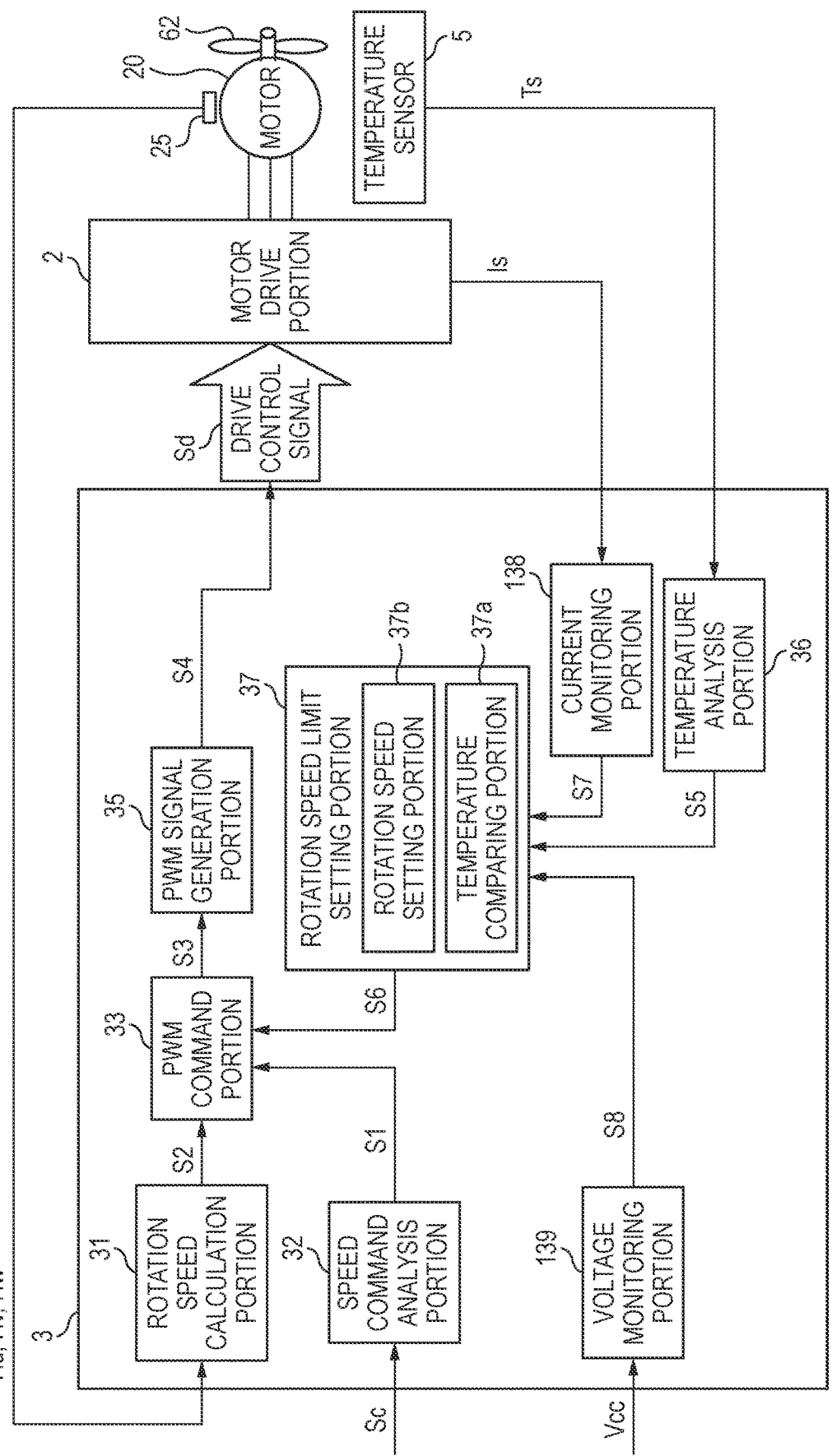
FIG. 12 is a diagram illustrating a motor drive control apparatus according to a modification example of the embodiment.

FIG. 12 is a diagram illustrating the motor drive control apparatus 101 according to a modification example of the embodiment.

Compared to the embodiment described above, in the motor drive control apparatus 101, the control circuit portion 3 further includes a current monitoring portion 138 for monitoring the current flowing in the motor 20 and a voltage monitoring portion 139 for monitoring the power supply voltage applied to the motor drive control apparatus 101 as illustrated in FIG. 12. In the following description, the same reference numerals and letters are given to the same constituent elements as those of the embodiment described above and the explanation thereof may be omitted in some cases.

In the motor drive control apparatus 101, the temperature comparing portion 37*a* of the rotation speed limit setting portion 37 compares the detected temperature S5 with the first temperature, the rotation speed setting portion 37*b* sets the upper limit value of the rotation speed of the motor 20 based on the comparison result of the temperature comparing portion 37*a*, a current monitoring signal S7 as the monitoring result of the current monitoring portion 138, and a voltage monitoring signal S8 as the monitoring result of the voltage monitoring portion 139.

The current monitoring portion 138 detects the driving current of the motor 20. The current monitoring portion 138 detects a current flowing from the motor drive portion 2 to the motor 20. The current monitoring portion 138 has, for example, a current detection resistor disposed between the inverter circuit 2*a* and the ground (GND). The current flowing through the motor 20 flows through, for example, the inverter circuit 2*a*, and then the current flows through the current detection resistor and flows to the ground (GND). The current monitoring portion 138 can detect the current flowing to the motor 20 from the voltage of both ends of the current detection resistor. As a result, the current monitoring portion 138 detects the driving current flowing through the motor 20 as a voltage signal Is. The current monitoring portion 138 compares, for example, the detected driving current with a predetermined current threshold value and outputs the comparison result as the current monitoring signal S7.

The voltage monitoring portion 139 is connected to a DC power supply Vcc of the motor drive control apparatus 101. The voltage monitoring portion 139 compares the power supply voltage with a predetermined voltage threshold value and outputs the comparison result as the voltage monitoring signal S8.

The detected temperature S5, the current monitoring signal S7, and the voltage monitoring signal S8 are input to the rotation speed limit setting portion 37. The rotation speed limit setting portion 37 outputs an upper limit restriction signal as the rotation speed limiting signal S6 when the predetermined setting condition is satisfied based on the detected temperature S5, the current monitoring signal S7, and the voltage monitoring signal S8. Further, in a case where the upper limit of the rotation speed is limited, when the predetermined release condition is satisfied, the steady control signal is output as the rotation speed limiting signal S6. Therefore, in the PWM command portion 33, the upper limit value of the rotation speed is set to the steady upper limit rotation speed or the limited rotation speed and the PWM setting value is calculated.

In the modification example, the setting condition and the release condition can be appropriately set. For example, whether to limit the rotation speed is switched according to the relationship between the detected temperature S5 and the first temperature or the second temperature as in the embodiment described above. Further, regardless of the detected temperature S5, whether to limit the rotation speed is switched when the current monitoring signal S7 indicating that the driving current exceeds the current threshold value or the voltage monitoring signal S8 indicating that the power supply voltage exceeds the predetermined voltage threshold value is input. Further, for example, the first temperature, the second temperature, or the first period of time and the second period of time may be changed in accordance with, for example, the current monitoring signal S7 and the voltage monitoring signal S8.

In the modification example, the upper limit value of the rotation speed is limited by taking into consideration the influence of the driving current flowing through the motor 20 and the power supply voltage of the motor drive control apparatus 101 on the heat-generating component. That is, when the driving state becomes a driving state where the temperature of the heat-generating component becomes extremely high, the upper limit value of the rotation speed is limited. Therefore, it is possible to thermally protect the non-heat-generating component and thermally protect the heat-generating component.

[Others]

The disclosure is not limited to a fan. It can be widely used in a motor device having a structure in which a non-heat-generating component is attached to a motor and a motor drive control apparatus for driving the motor device.

The motor device and the motor drive control apparatus thereof are not limited to the circuit configurations as illustrated in the embodiment and the modification example described above. Various circuit configurations configured to meet the object of the disclosure can be applied. The motor device and the motor drive control apparatus thereof may be configured by partially combining the features of the embodiment and the modification example described above. In the embodiment and the modification example described above, some constituent elements may not be provided or some constituent elements may be configured in other aspects.

At least a part of each constituent element of the motor drive control apparatus may be configured by a process by software instead of a process by hardware.

The motor driven by the motor drive control apparatus of the embodiment is not limited to a three-phase brushless motor and may be another type of a motor. The number of Hall elements is not limited to three. A detector different from the Hall element may be used to obtain the position detection signal of the motor. For example, a Hall IC or the like may be used. Further, the motor may be driven by a sensorless method without using a position detector such as a Hall element or a Hall IC.

The flowchart and the like described above illustrate an example for explaining the operation and the disclosure is not limited thereto. The steps illustrated in the respective figures of the flowcharts are specific examples and are not limited to the flow. For example, the order of each step may be changed or other processing may be inserted between the respective steps, or the processing may be parallelized.

A part or all of the processing in the embodiment described above may be performed by software or may be performed using a hardware circuit. For example, the control circuit portion is not limited to a microcomputer. At least a part of the internal configuration of the control circuit portion may be processed by software.

It is to be understood that the embodiment described above is an example in all respects and is not restrictive. The scope of the disclosure is defined not by the above description but by the scope of the claims and it is intended to include meanings equivalent to the claims and all modifications within the scope.

What is claimed is:

1. A motor drive control apparatus mounted on a motor device including a motor and a non-heat-generating component coupled to the motor, comprising:
   a temperature sensor that measures a temperature correlated with a temperature of the non-heat-generating component;
   a temperature comparing portion configured to compare a detected temperature based on a measurement result of the temperature sensor with a predetermined first temperature higher than a highest value of a design temperature of the motor device;
   a rotation speed setting portion configured to set an upper limit value of a rotation speed of the motor based on a comparison result of the temperature comparing portion; and
   a rotation speed control portion configured to control such that a rotation speed of the motor does not exceed the upper limit value set by the rotation speed setting portion.

2. The motor drive control apparatus according to claim 1, wherein when a predetermined setting condition including at least a condition that the detected temperature is higher than the first temperature is satisfied, the rotation speed setting portion sets the upper limit value to a first upper limit value lower than a second upper limit value set by the rotation speed setting portion when the setting condition is not satisfied.

3. The motor drive control apparatus according to claim 2, wherein the rotation speed control portion performs a control such that the motor rotates at a target rotation speed that does not exceed the upper limit value, and the first upper limit value is lower than the second upper limit value by a predetermined value.

4. The motor drive control apparatus according to claim 2, wherein the setting condition includes a condition that a state in which the detected temperature is higher than the first temperature continues for a predetermined first period of time.

5. The motor drive control apparatus according to claim 2, wherein when a predetermined release condition including at least a condition that the detected temperature is lower than a second temperature lower than the first temperature is satisfied in a state where the upper limit value is set at the first upper limit value, the rotation speed setting portion sets the upper limit value to a value higher than the first upper limit value.

6. The motor drive control apparatus according to claim 5, wherein the release condition includes a condition that a state in which the detected temperature is lower than the second temperature continues for a predetermined second period of time.

7. The motor drive control apparatus according to claim 1, wherein the temperature sensor is disposed on a circuit board equipped in the motor device, and
the temperature sensor is disposed at a position separated from a heat-generating component of the motor device by a predetermined distance or more.

8. The motor drive control apparatus according to claim 1, further comprising:
a temperature analysis portion configured to correct an influence of heat from a heat-generating component with respect to the measurement result of the temperature sensor to output the corrected temperature as the detected temperature.

9. The motor drive control apparatus according to claim 1, further comprising:
at least one of a current monitoring portion configured to monitor a current flowing in the motor and a voltage monitoring portion configured to monitor a power supply voltage applied to the motor device,
wherein the rotation speed setting portion sets the upper limit value based on the comparison result of the temperature comparing portion and at least one of a monitoring result of the current monitoring portion and a monitoring result of the voltage monitoring portion.

10. The motor drive control apparatus according to claim 1,
wherein the non-heat-generating component is an impeller.

11. A fan, comprising:
a motor;
a motor drive control apparatus that controls a motor-driving; and
an impeller coupled to the motor,
wherein the motor drive control apparatus includes:
a temperature sensor that measures a temperature correlated with a temperature of the impeller;
a temperature comparing portion configured to compare a detected temperature based on a measurement result of the temperature sensor with a predetermined first temperature higher than a highest value of a design temperature of the fun;
a rotation speed setting portion configured to set an upper limit value of a rotation speed of the motor based on a comparison result of the temperature comparing portion; and
a rotation speed control portion configured to control such that a rotation speed of the motor does not exceed the upper limit value set by the rotation speed setting portion.

12. A motor control method which is performed in a motor drive control apparatus mounted on a motor device including a motor and a non-heat-generating component coupled to the motor, the method comprising the steps of:
measuring a temperature correlated with a temperature of the non-heat-generating component;
comparing a detected temperature based on a measurement result with a predetermined first temperature higher than a highest value of a design temperature of the motor device;
setting an upper limit value of a rotation speed of the motor based on a comparison result; and
controlling such that a rotation speed of the motor does not exceed the upper limit value.

\* \* \* \* \*